United States Patent [19]
Schmitt

[11] Patent Number: 4,989,543
[45] Date of Patent: Feb. 5, 1991

[54] PROCESS AND MEANS FOR PRODUCING FILMS FOR USE IN ELECTRONICS AND/OR OPTOELECTRONICS USING PLASMA

[75] Inventor: Monsieur J. Schmitt, La Ville Du Bois, France

[73] Assignee: Solems (S.A.), Palaiseau, France

[21] Appl. No.: 257,905

[22] Filed: Oct. 14, 1988

[30] Foreign Application Priority Data

Oct. 15, 1987 [FR] France .................. 87 14245

[51] Int. Cl.$^5$ .................................................. C23C 16/00
[52] U.S. Cl. ............................................ 118/723; 118/723; 118/724; 118/725; 118/728; 427/38; 427/39
[58] Field of Search .................. 118/50.1, 715, 719, 118/723, 724, 725, 728; 427/39, 38

[56] References Cited

U.S. PATENT DOCUMENTS

4,047,496 9/1977 McNeilly et al. .................. 118/725
4,798,739 1/1989 Schmitt .................................. 427/39

FOREIGN PATENT DOCUMENTS

632675 11/1963 Belgium .................. 118/724
55-110033 8/1980 Japan .................. 118/715
60-10715 1/1985 Japan .................. 118/715
61-224410 10/1986 Japan .................. 118/715

Primary Examiner—Stanley Silverman
Attorney, Agent, or Firm—Pollock, VandeSande & Priddy

[57] ABSTRACT

Apparatus for producing thin film materials in a plasma deposit process. An enclosure is provided including a plasma zone. The apparatus removes non-deposited, residual gaseous reagents from the enclosure after heating the plasma zone for a predetermined time. An airtight chamber surrounds the enclosure and is kept at a pressure lower than the pressure within the enclosure. A screen is provided for directing heat to the enclosure, while maintaining the chamber walls at a lower temperature. In one embodiment of the invention, metal bellows are provided to apply a substrate support plate against a side wall of the enclosure sealing the substrate support with one of the side walls of the enclosure.

4 Claims, 3 Drawing Sheets

PROCESS AND MEANS FOR PRODUCING FILMS FOR USE IN ELECTRONICS AND/OR OPTOELECTRONICS USING PLASMA

FIELD OF THE INVENTION

The invention concerns a process for operating means designed to produce various types of films, such as amorphous or crystalline semiconducting films, for use in electronics and/or optoelectronics, using a plasma deposit process.

The invention also covers the means themselves.

BRIEF DESCRIPTION OF PRIOR ART

The prior art, notably French Pat. application No. FR-A-2,589,168, filed Oct. 25, 1985, by the present applicant, discloses means of this type. These means comprise:

an enclosed space in which the prevailing pressure is less than the atmospheric pressure;

means for creating a plasma zone within said enclosed space, said means comprising at least one electrode connected to an electric power source, at least one substrate, and means for introducing gaseous reagents into the plasma zone;

means for removing a residual portion of the gaseous reagents from the enclosure after said reagents have remained for a given period of time within the plasma zone; and a sealed chamber within which said enclosure is contained, said chamber being kept at a pressure lower than the pressure within the enclosure.

Despite the advantages of removing the residual portion of the gaseous reagents and of creating a pressure differential between the outer chamber and the deposit enclosure, it has not been possible using the means described above to obtain sufficient control over problems of contamination and degradation of the electronic properties of the materials being formed.

Although the use of suction has proved effective in removing a large portion of the impurities found in the atmosphere surrounding the deposit zone, no elucidation has been provided for the underlying problem of contaminating flux caused, for the most part—and given the operating conditions of the system—by gaseous emissions from the walls of the enclosure (and from the substrates and other supporting media). These walls adsorb a multitude of molecules.

It has become apparent that the surface "decomposition" or degassing of the constituents of the system proximate to the deposit zone (also called the plasma zone) can alter the electronic properties of the semiconductors. This situation is aggravated by the "semisealed" nature of the inner reaction enclosure within which the substrate support plates, on which the substrates are mounted, are in non-leak-tight contact, at their edges, with the side walls of the enclosure. The side walls in turn are sealed to the front and back closures of the enclosure. The front and back closures are connected in a leakproof way to an inlet conduit for the admission of gaseous reagents and an outlet conduit for the evacuation of the nondeposited residuals of these reagents.

It has been noted that as a result of this incomplete sealing of the substrate support assembly, and despite the pressure in the sealed outer chamber being lower than that in the reaction enclosure, certain impurities, resulting for the most part from degassing on the chamber walls, tended to move against the flow of suction from enclosure to chamber and to enter the enclosure, impinging on the quality of the materials being formed.

SUMMARY OF THE INVENTION

These problems of product purity have been solved in accordance with the process of the instant invention by heating the walls of the inner enclosure while keeping the walls of the outer chamber at a temperature lower than that of the enclosure.

It has become apparent that heating the walls of the reaction enclosure during, and preferably prior to, the deposit phase to a temperature of between 150° to 250° C. (and possibly to as high as 350° C. during preheating) makes it possible to limit greatly the spread, due to degassing, of contaminating matter in or near the atmosphere of the enclosure, thereby facilitating the removal of such matter while reducing the risk of its passing, against the current, through the exhaust cracks of the substrate supports.

By virtue of an additional characteristic of the invention, the risk of certain contaminants penetrating the enclosure can be reduced to the point of practical elimination.

To do this, the invention calls for thrust to be exerted at the periphery of the substrate supports (the point at which their connection with the enclosure walls is imperfect). The thrust serves to press said substrate supports against the walls in a leaktight manner. In view of the rigorous operating conditions of the system, it was decided that said thrust should be applied through mechanical bellows expanding in the direction of the force to be exerted. In practice, said bellows expand across the interior space separating the sealed chamber from the enclosure and are joined to conduits connected to pressurizing means such as one or more air compressors.

In this way, any impurities present in the chamber are unable to enter the enclosure, particularly at critical moments such as the phase during which films are being deposited.

It will be noted that, in the interest of efficiency and in order to make the system more flexible to use, the inner enclosure should be heated while the walls of the outer sealed chamber are advantageously kept at a maximum temperature of about 80° C.

By means of such an arrangement it is possible to preserve an acceptable environment around the system without recourse to very sophisticated sealing or vacuum devices or means of thermal protection that would have been practically indispensable given the intense vacuum (around $10^{-6}$ to $10^{-7}$ Pa) that would otherwise be required to avoid contaminating materials deposited by plasma.

Returning to the principle of raising the temperature of the enclosure, the invention further provides that said temperature is to be raised by heating means that may be installed in the space between the enclosure and the sealed outer chamber.

The walls of the sealed outer chamber may be maintained at a suitably temperature (below 80° C. for practical purposes) through the use of means serving as a thermal shield and covering at least the majority of the inner surface of the chamber walls.

At this point in the description it will be noted that these are important advantages over machines of the "ultra high vacuum" (UHV) type presently being used to produce certain semiconductors. In fact, in order to limit flux due to degassing, the UHV technique requires heating the machine to 250° C. or even 450 C. and subjecting it to a vacuum of less than 10−5 Pa (usually on the order of 10−7 Pa).

Furthermore, due to the temperature and pressure conditions which such machines must withstand, all walls must be made of highly resistant material (electropolished stainless steel, molybenum, and the like) and all seals must be metallic (copper, gold, or other) and may only be used once. Furthermore, problems of thermal expansion and play between parts are particularly difficult to control for reasons that are easily understood.

The operating constraints of UHV machines thus have nothing in common with the system of the invention.

The characteristics and advantages of the invention will be more clearly apparent from the following description, made with reference to the appended drawings, in which:

DETAILED DESCRIPTION OF THE INVENTION

Figure 1:
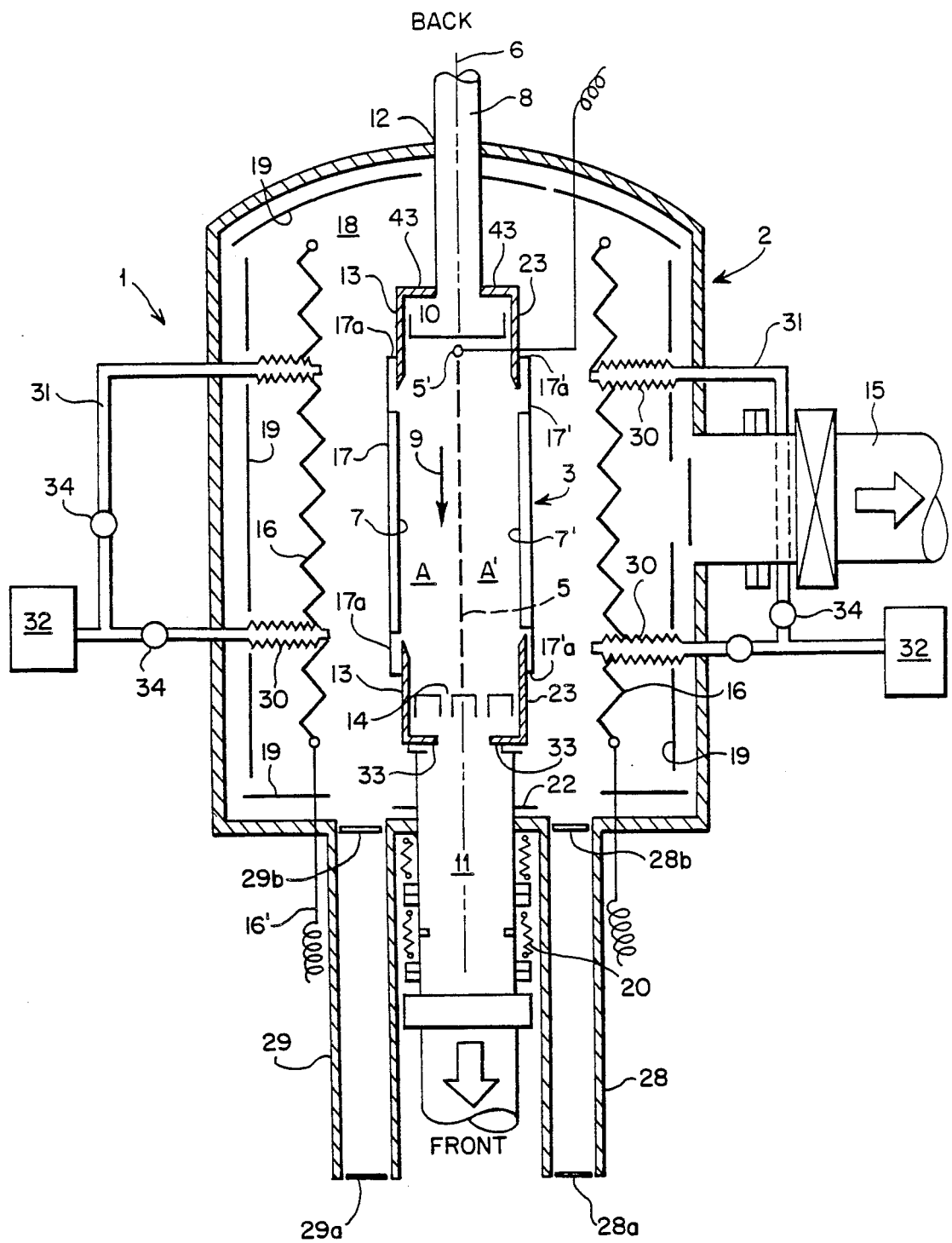
FIG. 1 is a schematic and median cross-section of the means of the invention.

In thee figures, the means for producing amorphous films using a plasma deposit process are generally of the same type as those described in the aforementioned French Pat. application FR-A-2,589,168, to which reference may be made.

The system comprises a sealed outer chamber 2 capable of withstanding a partial vacuum of approximately $10^{-4}$ to $10^{-5}$ Pa. Inside chamber 2 is a relatively elongated enclosure 3. WIthin said enclosure a double plasma zone 4, 4' may be created between a center electrode 5 and two substrates 7 and 7'. Electrode 5 is essentially parallel to the overall axis 6 of the enclosure and is connected at its head 5' to a high voltage power source. Substrate support plates 17, 17', upon which are mounted substrates 7, 7', rest, along edge 17a, 17'a against side walls 13, 23 of the enclosure. The side walls 13, 23 are sealed to front closure 33 and back closure 43, to which conduits 11 and 8, respectively, are sealed.

Here the substrates are parallel to each other and face the plasma zone.

Conduit 8, which leads into the back longitudinal end of the enclosure after having passed (in a leaktight manner at point 12) through the wall of chamber 2, supplies the plasma zone with the gaseous reagents required for the production of the films.

In FIG. 1, the front and back sides of the enclosure have been so designated (FRONT and BACK). This refers to the direction of the gaseous reagents circulating within the system, as illustrated by arrow 9.

Toward the back end of the enclosure, the reagents encounter their first obstacle, or divider, 10, which is designed to improve distribution of the gases within the enclosure.

After the gases have been exposed for a time to the plasma generated by the excitation of electrode 5 and have been partially deposited on the substrates, the nondeposited residual gas is evacuated from the enclosure through conduit 11, which passes (in a leaktight manner at point 22) through the front longitudinal end 11 of the enclosure, to which end said conduit 11 is connected.

A pump, such as a vacuum pump, may be used to draw out the residual matter that must be removed.

It will be noted that in order to maintain a relatively low flow rate and pumping pressure, the circulating gases encounter a second obstacle 14 near the front end of the enclosure.

In a manner that is in itself known, the material used to produce the films will be a base material, generally an acceptable gas introduced at a pressure of approximately $10^1$ Pa which will provide the plasma regions with basic constituents. Following decomposition of the base material by electric discharge, said constituents are deposited on the substrates in the form of thin films. For example, silicon tetrafluoride and silane maya be used as the base materials for producing silicon films. Various types of doping agents may be used.

Referring again to FIG. 1, it can be seen that sealed outer chamber 2 surrounding the deposit enclosure is placed under vacuum through conduit 15, which is connected to a vacuum pump (not shown) of a power adequate to produce a vacuum of approximately $10^{-4}$ to $10^{-5}$ Pa.

Despite the advantages they offer, all of these known characteristics together do not make it possible to limit the degassing flux from enclosure 3 and from various related parts (including substrates and electrode).

In order to solve this problem under industrially acceptable conditions, the invention calls, inter alia, for raising the temperature of the enclosure using means such as zig-zag resistance elements installed in space 18 between the enclosure and the chamber. The resistance elements 16 are connected to suitable electric power sources and their supply leads 16' pass in leaktight manner through the wall of chamber 2.

The heating elements used must be able to raise the temperature of the walls of enclosure 3 to a temperature between 100° and 300° C. (approximately) while the films are being deposited on the substrates. In practice, under usual operating conditions, the approximate temperature range will be between 150° and 250° C. Nevertheless, the upper limit may be exceeded. In fact, the hotter the enclosure gets (short of damaging it), the greater the reduction of the degassing flux that is so harmful to the electronic quality of the semiconductors being produced.

It will be noted that in some cases it may be useful to preheat the enclosure to a temperature of approximately 300° to 350° C. prior to introducing the deposit material, which may also be preheated to a temperature about 50° C. hotter than the nominal deposit temperature.

Among other things, this preheating of the enclosure serves to clean the wall surfaces, further limiting their later degassing.

With the same idea in mind, conduit 11, used for the evacuation of residual matter, maya itself be heated by resistance elements 20, also preferentially to an approximate temperature of between 150° and 250° C.

In order to direct toward the enclosure the heat given off by heating elements 16 and to thermally shield the walls of outer chamber 2 so as to keep it at a temperature of below 80° C. (approximately), the preferred solution of the invention, as illustrated in the figures, is to cover the greater part, if not all, of the inner surface of the walls of chamber 2 with thermal shields 19. The shields may be made of burnished aluminum. Their "mirror" surface would face into the chamber.

The thermal shields may be complemented or replaced by other means for cooling the chamber walls, such as a coolant circulating along the walls.

The invention might also have called for the use of refractory material for the chamber walls. However, the combination of thermal shields and metal (treated steel) chamber walls appears to be the most technically satisfactory and industrially cost-effective solution.

Of course, keeping the chamber walls at a low temperature will not reduce degassing flux from the walls. However, because of the pressure difference established between enclosure and chamber during the deposit process, this does not present a problem in this case.

Nevertheless, despite the depressurization of chamber 2 with respect to the reaction enclosure, impurities from the chamber tend to penetrate the enclosure, as noted above, and, after decomposing in plasma zone 4, 4', become incorporated into the films deposited on the substrates, thereby lowering the electronic quality of the films.

The absence of a seal in the contact between substrate support plates 17, 17' and walls 13, 23 appears to be the chief cause of the entry of these impurities.

However, a series of tests and analyses has shown that an extremely tight seal is not indispensable, since the benefit produced by the sealing of the substrate supports continues to be affected by heating of the reaction enclosure.

As a general rule, it is estimated that for an enclosure 3 with a volume of 0.03 m$^3$ adequate to process two substrates 7, 7' approximately 30×30 cm$^2$ in size, the approximate leak rate at the joint between the substrate supports and the walls of the enclosure should be less than $10^{-3}$ m$^3$/s, and preferentially below $0.3 \cdot 10^{-3}$ m$^3$/s. This corresponds essentially to the leak rate produced by a slit approximately 3 m long by $10^{-2}$ m deep by 50 μm ($50 \times 10^{-5}$ m) wide.

Of course, an acceptable leak rate could well have been achieved using mechanical fasteners (e.g., screws or bolts) if the parts in question had been intended to be fixed in place. In this case, however, it must be possible to replace the substrate supports. Thus they must be movable.

For this reason, the system is provided with two lock chambers 28, 29 in known fashion. The lock chambers are placed against the wall of chamber 2. Each comprises, in a manner that is in itself known, two access gates, one 28a, 29a, linking the lock chamber with the outside, and another 28b, 29b linking the lock chamber with the interior of chamber 2. By virtue of said lock chambers, the installation and removal of the substrate supports can be accomplished under optimal conditions. In practice, depressurized mechanical conveyors (now shown) carry the substrate supports, bringing out of the enclosure substrates onto which films have been deposited and carrying into the enclosure untreated substrates.

Because the substrate supports must be movable, they cannot be sealed to the walls of the enclosure by rigid fastening means such as welding or bolting.

For this reason the invention calls for the exertion of mechanical pressure on the substrate supports in such a way as to apply the latter tightly against the corresponding wall sections but only when required, i.e., during the film deposit phase and possibly while the enclosure is being preheated.

The practical solution adopted is illustrated in the figures. It involves a series of retractable, pneumatic metal bellows 30 placed within the inner space 18 between chamber 2 and enclosure 3 in such a way that the free end of each bellows will, whenever necessary, apply the edge of the substrate supports against the corresponding side walls 13, 23 of the enclosure with force adequate to produce an effective seal.

In order to operate bellows 30, the latter are connected to conduits 31 that pass in leaktight fashion through the wall of chamber 2. The conduits 31 are in turn joined to pressurization means such as one or more air compressors 32 that make it possible, if necessary, to control each bellows independently, e.g., by means of regulator valves 34.

Simply varying the gas pressure within the bellows will cause them (1) to expand (see arrows F of FIG. 2), thus keeping the substrate supports sealed against the enclosure, or (2) to retract, allowing the substrate supports to be removed for collection and replacement of the substrates.

Figure 2:
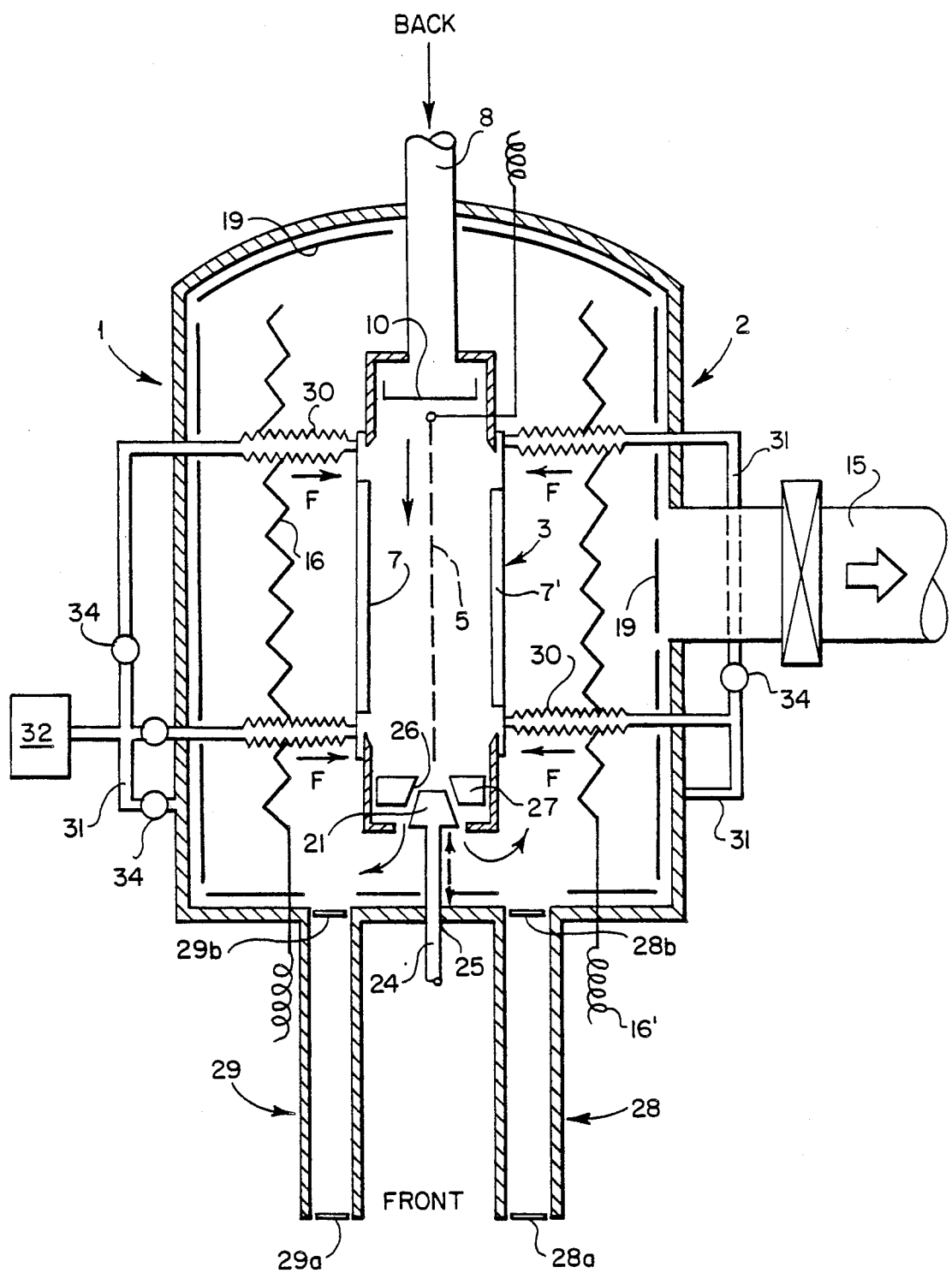
FIG. 2 shows a variant of the same means.

FIG. 2 illustrates a variant of the means of the invention. In this variant, the front longitudinal end of enclosure 3 empties into the interior of chamber 2. No longer present is conduit 11, which served to direct residual matter outside the chamber. Instead, vacuum pipe 15 here serves not only to remove degassing flux generated by the walls of enclosure and chamber but also to remove residual matter that may be circulating within the enclosure.

FIG. 2 also illustrates a means for regulating obstacle 14 at the downstream end of the enclosure. In FIG. 2 said obstacle takes the form of a tapered plug 21 set up so as to engage with correspondingly shaped bearing surfaces 26 formed in a piece 27 set toward the front end of the enclosure. Plug 21 is prolonged outside the chamber in the form of a control rod 24, which passes through the chamber wall in a leaktight manner. Other control means, e.g., valves operable from outside the chamber by means of a control linkage, may be foreseen. It will be understood as well that the same means might be provided for the control of obstacle 10 at the entrance to the enclosure, and that the embodiment illustrated in FIG. 1 might also benefit from the use of such means.

Figure 3:
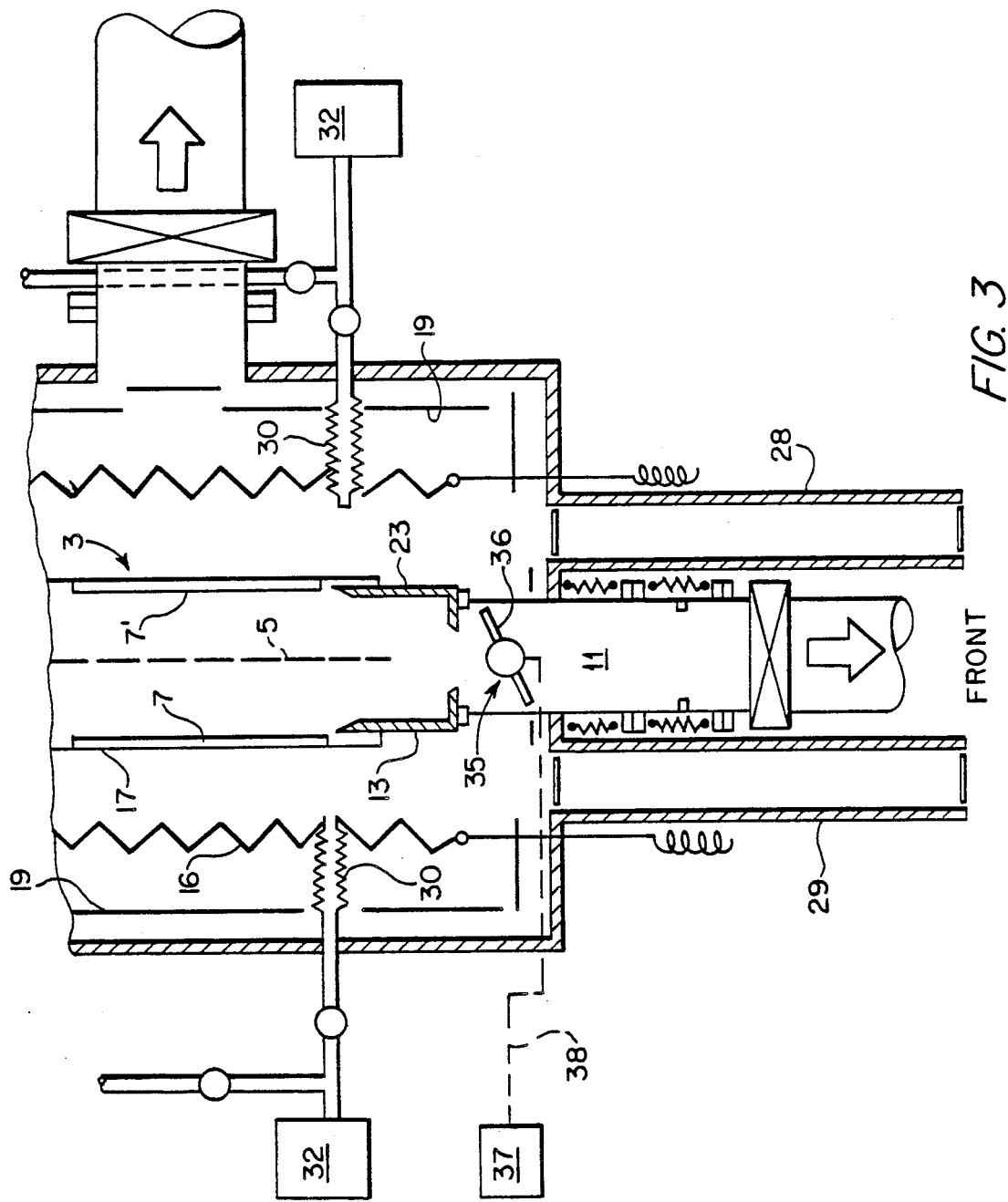
FIG. 3 is a partial view of the means of FIG. 1 equipped with a means for adjusting the flow of gas circulating in the reaction enclosure.

FIG. 3 illustrates this possibility. Here, the end of enclosure 3 emptying into evacuation conduit 11 is provided with a solenoid 35, the adjustable valve 36 of which is controlled by a control unit 37 to which it is connected by cable 38.

It is noted that although only a single arrangement of substrates and electrodes has been discussed (involving two substrates and one electrode), this in no way excludes other arrangements, e.g., a double substrate in the center with an electrode on either side or a nonsymmetrical layout of the reaction enclosure. Furthermore, a single substrate support holding just one substrate might be used.

Among the films that might be deposited in a plasma reactor of the type described above are:
Semiconductors:
Silicon germanium, carbon, and their alloys.
Possibly arsenide and gallium.
The morphology of the semiconducting films will vary with the conditions of deposit and the nature of the substrate but may be:
amorphous
microcrystalline monocrystalline (epitaxy).

Insulators:

Silicon oxide, silicon nitride

Conductors (in certain cases):

Aluminum, tungsten

Tunsten silicide.

The added gases are organometallics, volatile fluorides, or metal carbonyls.

What is claimed is:

1. Apparatus for producing thin films using a plasma deposit processing comprising:

a non-airtight enclosure in which the prevailing pressure is less than the atmospheric pressure for containing at least one substrate;

means for creating a plasma zone containing said at least one substrate within said enclosure, said means comprising at least one electrode connected to an electric power source;

means for introducing film producing gaseous reagents into said plasma zone;

means for removing the non-deposited residual portion of said gaseous reagents from said enclosure after said reagents have remained for a given period of time within said plasma zone;

an airtight chamber surrounding said enclosure, said chamber being kept at a pressure lower than the pressure within said enclosure;

means for heating said enclosure, said means being disposed within a space separating said enclosure form said chamber, for maintaining walls of said chamber at a temperature that is lower than the temperature of said enclosure; and, two obstacles that restrict the flow of the film-producing gaseous reagents into said enclosure through two openings in said enclosure, said obstacles being situated at opposite ends of said enclosure into which and from which said gaseous reagents are moved at least one of which is adjusted from outside said chamber to change the size of a respective opening.

2. Apparatus for producing thin films using a plasma deposit process comprising:

an enclosure in which the prevailing pressure is less than the atmospheric pressure;

means for creating a plasma zone within said enclosure, said means comprising at least one electrode connected to an electric power source, at least one substrate, and means for introducing film producing gaseous reagents into said plasma zone;

at least one substrate support plate supporting a substrate which rests on and is removable from at least one corresponding side wall of said enclosure;

means for removing the non-deposited residual portion of said gaseous reagents from said enclosure after said reagents have remained for a given period of time within said plasma zone;

an airtight chamber surrounding said enclosure, said chamber having an internal pressure lower than the pressure within said enclosure;

means for heating said enclosure, said means being disposed within a space separating said enclosure from said chamber; and means for applying in a substantially leak-proof manner the substrate support plate to said at least one corresponding side wall of the enclosure comprising a pressurizable metal bellows capable of exerting pressure against the substrate support plate, forming an airtight seal with a sidewall of the enclosure, said bellows expanding into the space separating said chamber from said enclosure and being connected to gas feed conduits which are joined to means for pressurizing said bellows.

3. Apparatus for producing thin films in accordance with claim 1 further comprising:

at least one substrate support plate supporting a substrate which rests on and is removable from at least one corresponding side wall of said enclosure; and, means for applying in a substantially leak-proof manner the substrate support plate to said at least one wall of the enclosure.

4. Apparatus according to claim 3 wherein said means for applying the substrate support plate to one of said side walls of the enclosure maintain a slit between said support plate and said side wall.

* * * * *

UNITED STATES PATENT AND TRADEMARK OFFICE
CERTIFICATE OF CORRECTION

PATENT NO. : 4,989,543
DATED : February 5, 1991
INVENTOR(S) : Jacques Schmitt

It is certified that error appears in the above-identified patent and that said Letters Patent is hereby corrected as shown below:

Column 2, line 62, change "suitably" to --suitable--.

Column 3, line 3, change "450 C." to --450°C.--.

Column 3, line 4, change "10-5" to --$10^{-5}$--.

Column 3, line 5, change "10-7" to --$10^{-7}$--.

Column 3, line 32, change "thee" to --these--.

Column 3, line 40, change "WIthin" to --Within--.

Column 4, line 18, change "maya" to --may--.

Column 4, line 45, change "exceded" to --exceeded--.

Column 4, line 59, change "maya" to --may--.

Column 5, line 55, change "now" to --not--.

Column 7, line 30, change "form" to --from--.

Signed and Sealed this

Twenty-first Day of July, 1992

*Attest:*

DOUGLAS B. COMER

*Attesting Officer*     *Acting Commissioner of Patents and Trademarks*